United States Patent

Kumar et al.

[11] Patent Number: 6,016,534
[45] Date of Patent: Jan. 18, 2000

[54] DATA PROCESSING SYSTEM FOR CONTROLLING OPERATION OF A SENSE AMPLIFIER IN A CACHE

[75] Inventors: Manoj Kumar; Huy Van Pham, both of Austin, Tex.

[73] Assignee: International Business Machines Corporation, Armonk, N.Y.

[21] Appl. No.: 08/887,825

[22] Filed: Jul. 30, 1997

[51] Int. Cl.[7] .......................... G06F 13/00; G11C 11/413
[52] U.S. Cl. .......................... 711/154; 711/128; 711/167; 365/49; 365/205; 365/210
[58] Field of Search ..................... 711/118, 128, 711/167, 154; 364/227, 205, 210, 49; 395/750.06, 750.03

[56] References Cited

U.S. PATENT DOCUMENTS

| | | | |
|---|---|---|---|
| 5,018,111 | 5/1991 | Madland | 365/233 |
| 5,430,683 | 7/1995 | Hardin et al. | 365/227 |
| 5,550,774 | 8/1996 | Braver et al. | 365/189.02 |
| 5,668,766 | 9/1997 | Bramnik | 365/205 |
| 5,715,426 | 2/1998 | Takahashi et al. | 364/205 |
| 5,848,428 | 12/1998 | Collins | 711/128 |
| 5,860,127 | 1/1999 | Shimazaki et al. | 711/167 |

*Primary Examiner*—Glenn Gossage
*Attorney, Agent, or Firm*—Kelly K. Kordzik; Winstead Sechrest & Minick P.C.; Anthony V. S. England

[57] ABSTRACT

A cache memory device having circuitry for controlling operation of a sense amplifier for accessing an array in the data processing system including a cache memory device includes circuitry for enabling the sense amplifier when there is a hit in the array as a result of a read request and disables the sense amplifier when there is a miss in the array as a result of the read request. The cache memory device may receives an address associated with the read request, and compares the address to addresses associated with entries in the array, wherein a hit results when the received address matches at least one of the addresses associated with the entries in the array, and wherein a miss results when the received address does not match at least one of the addresses associated with the entries in the array. The address associated with the read request and the addresses associated with entries in the array are effective addresses. The cache memory device may enable the sense amp only when the array is being accessed by the read request, and only after an entire address associated with the read request has been received.

6 Claims, 7 Drawing Sheets

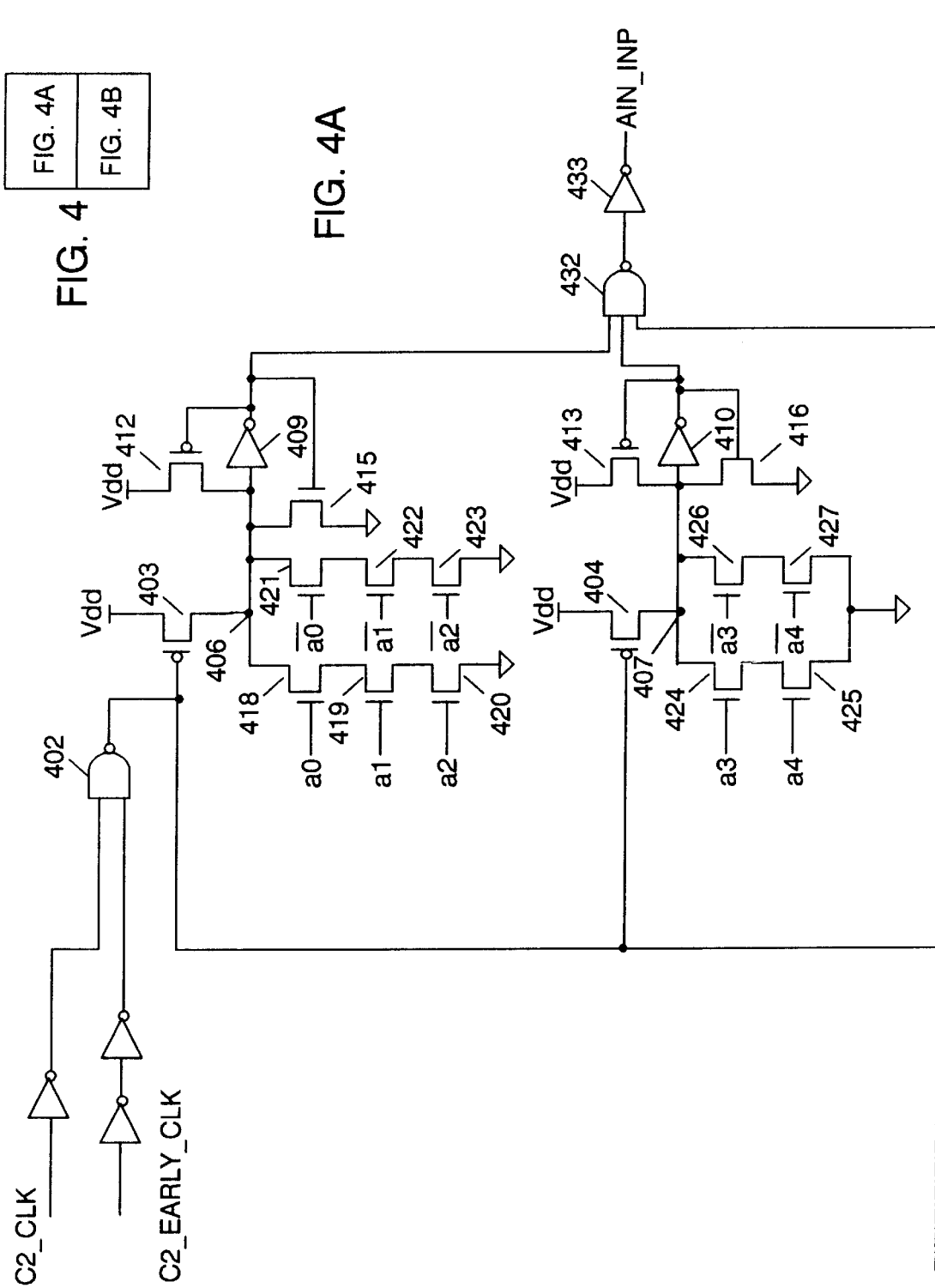

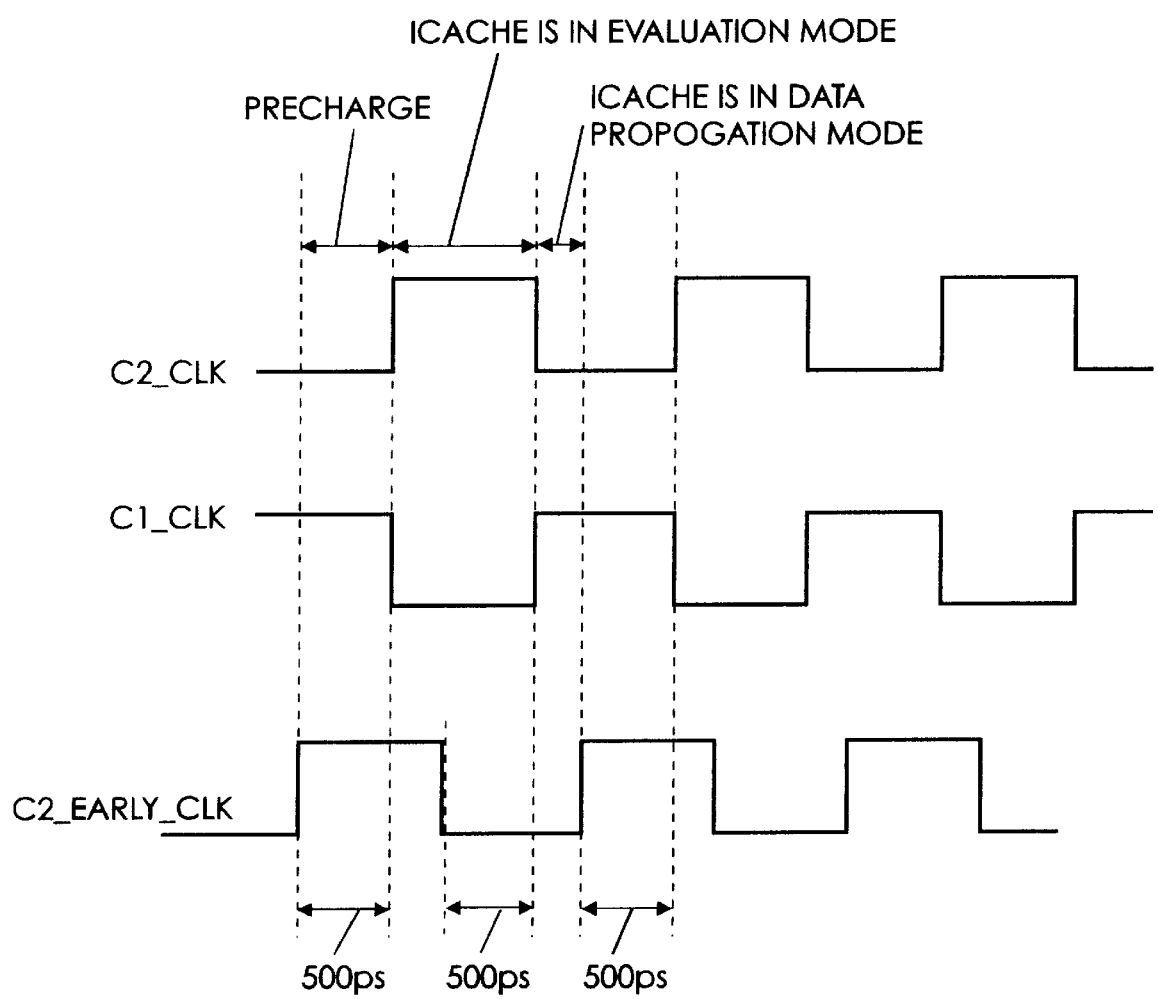

DATA PROCESSING SYSTEM FOR CONTROLLING OPERATION OF A SENSE AMPLIFIER IN A CACHE

TECHNICAL FIELD

The present invention relates in general to data processing systems, and in particular, to reading and writing data in a cache memory.

BACKGROUND INFORMATION

Caches are an integral part of a microprocessor. The speed of a microprocessor is dependent upon how fast a cache can be accessed. Level 1 (L1 or primary) and Level 2 (L2 or secondary) caches are becoming faster and their array sizes are growing bigger and more complex.

A sense amplifier ("amp") is a crucial part of the cache. If the sense amp does not work properly, the cache will send wrong data or instructions which can be a catastrophe within the running of a program. Consequently, due to the many different modes of operation of the cache, it becomes very important to have an effective sense enable generator circuit to properly control the sense amp operation.

It is also important that operation of the sense amp be utilized only when required to access information stored in the cache, since the continual activation of the sense amps generates undesirable heat, which then needs to be dissipated. Therefore, there is a need in the art for an effective, efficient and reliable sense enable generator for a cache.

SUMMARY OF THE INVENTION

The previously mentioned needs are fulfilled with the present invention. Accordingly, there is provided, a cache memory device having circuitry for controlling operation of a sense amp for accessing an array in the cache memory device, the circuitry comprising circuitry for enabling the sense amp when there is a hit on the array as a result of a read request and circuitry for disabling the sense amp when there is a miss on the array as a result of the read request. The read request is received from a processor coupled to the cache memory device.

In one embodiment the cache memory device further comprises circuitry for receiving address bits associated with the fetch (read) request. These address bits are issued by the processor as effective addresses. If these effective address bits are identical to the content of the effective content address memory (ECAM), then it is a "HIT" in the cache. If one or multiple address bits are not identical then it is a "MISS" in the cache.

In another embodiment, the address associated with the read request and the addresses associated with entries in the array are effective addresses.

The cache memory device may further include circuitry for enabling the sense amp only when the array is being accessed by the read request, and circuitry for enabling the sense amp only after an entire address associated with the read request has been received and if there is an ECAM HIT.

One advantage of the present invention is that if there is a miss in the cache, the sense enable signal will be low. If the sense enable signal is not dependent upon a determination of whether or not there is a hit in the cache, then the sense amp will keep firing every read cycle. If there is a miss in the cache, then the wordline is low and the bit line pairs (bit line true and complement) will be at a precharge level of VDD. The data line pair, which is input to the sense amp, will follow the bit lines and will be at a VDD level. When the sense amp enable signal goes high, the output of the sense amp will go to an undetermined state because there is no differential voltage on the input of the sense amp. After some delay, the sense amp will resolve itself by going to some known state. During the undetermined state, the sense amp will burn a lot of power (there will be a DC path from VDD to ground). Since there may be 332 sense amps in the cache, there will be a lot of power transferred to ground. The ground level will rise and will effect the functionality of the other circuits in the cache. The present invention relieves the foregoing problem by preventing this problem in the cache by deactivating the sense amp when there is a miss in the cache.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 comprises FIGS. 4A and 4B, wherein FIGS. 4A and 4B illustrate a portion of logic circuitry implemented within said read control block 312 illustrated in FIG. 3;

FIG. 7 illustrates a timing diagram of internal clocks used in circuits of the present invention.

DETAILED DESCRIPTION

Figure 1:
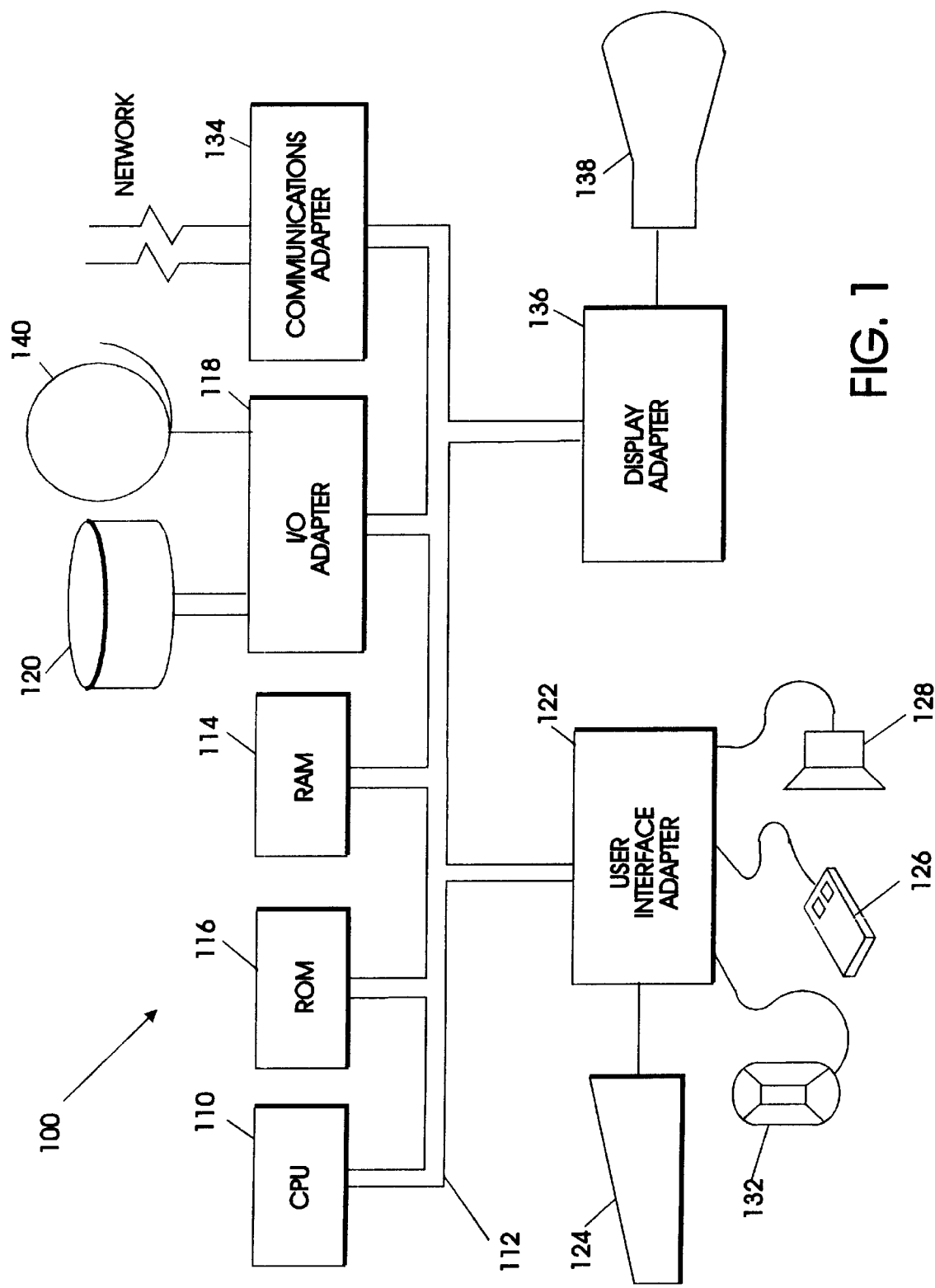
FIG. 1 illustrates a data processing system configurable in accordance with the present invention.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

A representative hardware environment for practicing the present invention is depicted in FIG. 1, which illustrates a typical hardware configuration of workstation 100 in accordance with the subject invention having central processing unit (CPU) 110, such as a conventional microprocessor, and a number of other units interconnected via system bus 112. Workstation 100 includes random access memory (RAM) 114, read only memory (ROM) 116, and input/output (I/O) adapter 118 for connecting peripheral devices such as disk units 120 and tape drives 140 to bus 112, user interface adapter 122 for connecting keyboard 124, mouse 126, speaker 128, microphone 132, and/or other user interface devices such as a touch screen device (not shown) to bus 112, communications adapter 134 for connecting workstation 100 to a data processing network, and display adapter 136 for connecting bus 112 to display device 138. CPU 110 may include other circuitry not shown herein, which will include circuitry commonly found within a microprocessor, e.g., execution unit, bus interface unit, arithmetic logic unit, etc. CPU 110 may also reside on a single integrated circuit.

Figure 2:
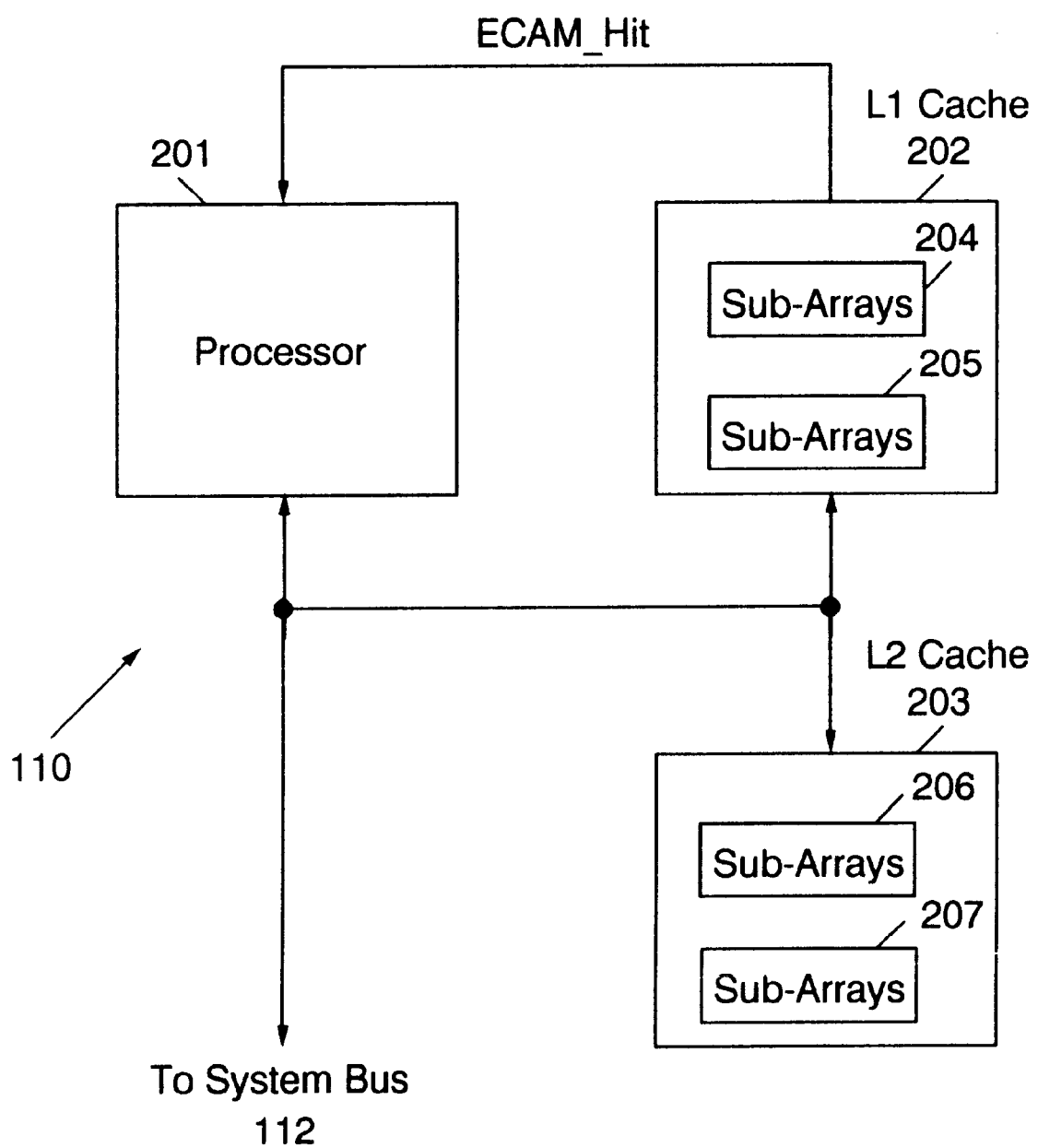
FIG. 2 illustrates a more detailed block diagram of the processor illustrated in FIG. 1.

Referring next to FIG. 2, there is illustrated a more detailed block diagram of CPU 110, which includes processor 201, L1 (primary) cache 202, and L2 (secondary) cache 203, which are coupled together and coupled to system bus 112. Note that L1 cache 202 may be an on-chip cache with processor 201, while L2 cache 203 may be an off-chip cache.

L1 cache 202 may include several sub-arrays (DCACHE, ICACHE, LRU, BAT, BTAG, etc.) 204, 205. Likewise, L2 cache 203 may include one or more arrays 206 and 207.

When the processor 201 needs the instruction for execution, it issues and effective address (EA) which is 64 bits wide for this microprocessor. The effective address is the address generated by the processor 201 for load or store of the instruction or for instruction fetch. The effective address is presented to the instruction L1 cache (ICACHE) 202 first. If the effective address bits match completely against the content of effective content address memory (ECAM) 308 (shown in FIG. 3), then ECAM_Hit from ICACHE 202 will go high. This means that the instruction which the processor 201 requested is residing inside the ICACHE 202. If the effective address bits do not match the content of ECAM 308, then signal ECAM_Hit will go low. This means that the requested instruction does not reside inside the ICACHE 202. If the requested instruction does not reside inside the ICACHE 202, then the effective address is presented to L2 cache 203. L2 cache 203 is bigger than L1 cache 202 in size and it can store more data and instructions than L1 cache 202. If neither of L1 cache 202 or L2 cache 203 contain the requested information, then the requested information may be retrieved from an external memory source via system bus 112, such as RAM 114 or hard disk 120.

Figure 3:
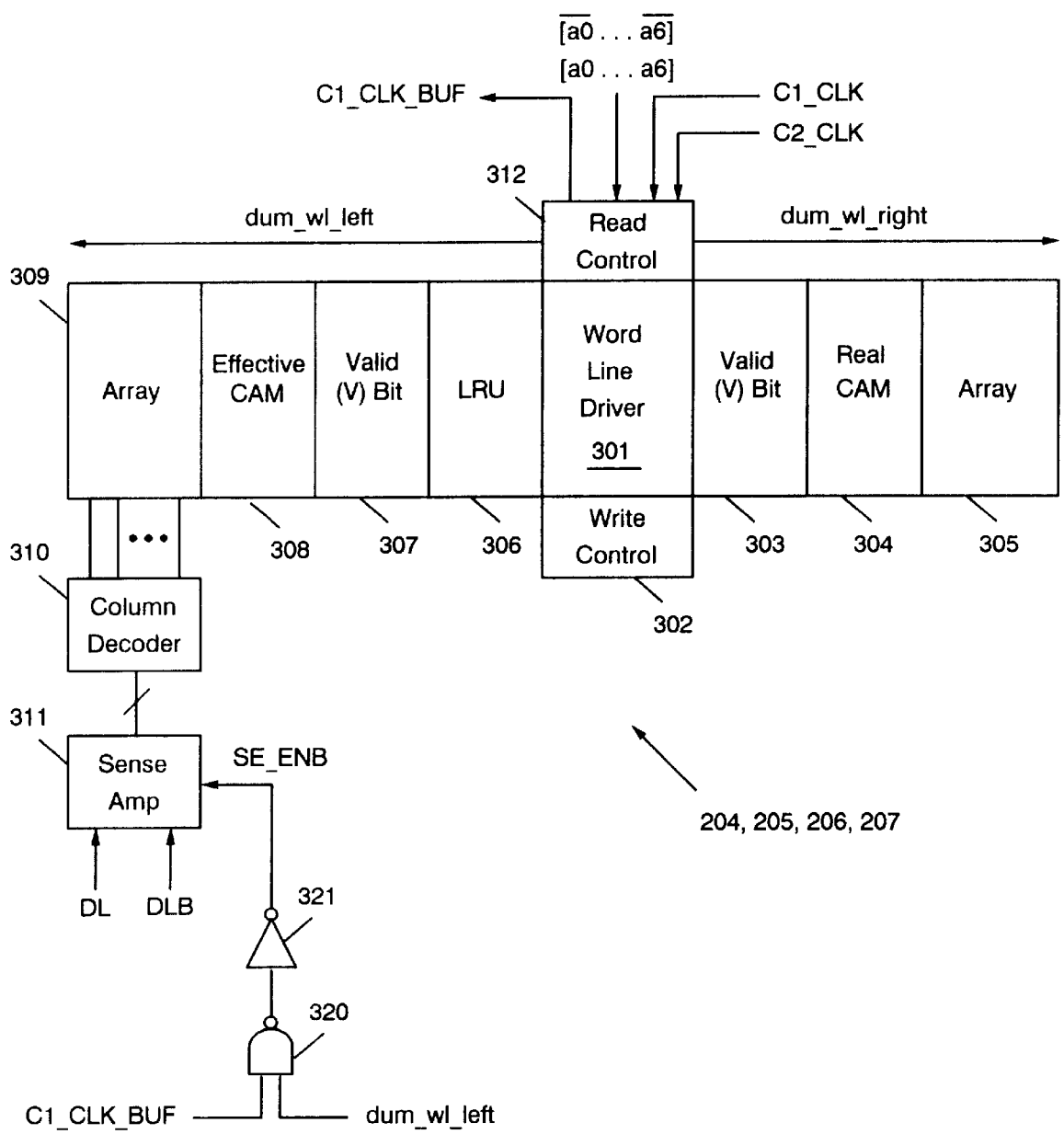
FIG. 3 illustrates a more detailed block diagram of a cache array.

Referring now to FIG. 3, there is an illustration of a more detailed picture of L1 cache 202. This ICACHE 202 has wordline driver 301 which is positioned in the middle. On the left side of the wordline driver 301 there is least recently used (LRU) 306, valid bit (VBIT) 307, effective content address memory (ECAM) 308 and array 309. The array 309 is 640 bits wide (in X direction) and 130 deep (in Y direction), ECAM 308 is 12 bits wide and 130 bits deep, VBIT 307 is 1 bit wide and 130 bits deep and LRU is 130 bits deep. On the right side of the wordline driver 301 there is 1 bit wide and 130 bits deep VBIT 303. Real content address memory (RCAM) 304 is 32 bits wide and 130 bits deep. The array 305 is the same size as the left side array 309 which is 640 bits wide and 130 bits deep. Both the VBIT's are identical (left and right side) and they hold the same values.

The purpose of the VBIT 307 is to determine if the particular line is valid or not. If the VBIT=1, then that particular line is valid. The instruction or the data can be read from that line and the contents of ECAM 308, RCAM 304 and the arrays 305, 309 are valid or good. Also, if VBIT=1, and if the instruction or data are brought from L2 cache 203 or main memory or I/O's for refill (write), it will be not written on that particular line because that line has valid information. That line cannot be modified. If VBIT=0, it means that the particular line is not valid. This means that the information will not be read from that line. A refill (write) operation can be performed on that line since it does not have valid information for a read operation.

The least recently used (LRU) 306 bit is used to replace (write) a line. Whenever there is a miss in the cache, the information is brought from L2 cache 203 or main memory or input/output devices. In this microprocessor 110, a token system is used to replace the line. Initially, when the processor 201 is powered up, the token is forced to sit on the first line of the cache. If that line is refilled (written), the VBIT is set to 1 and the token will jump to the second line. As the line in the cache is being refilled, the VBIT will be set to 1 and the token will keep jumping to the next line. If all the lines are filled (128 lines), then the token will go back to line 1 since that line was least recently used. If there is a request for refill (write) the line where the token is residing will be refilled (write). This way the LRU 306 works.

The effective address bits which are issued by the processor 201 also go to a segment address translation array (not shown). The segment address translation array outputs drive the virtual address translation. This virtual address translation drives the look up page table which generates the real address for ICACHE 202. If the real address bits (32 bits) match with the content of the real content address memory (RCAM) 304 then it is a real "HIT" in ICACHE 202.

Individual addresses within arrays 309 and 305 may be accessed by a plurality of column decoders 310, which are coupled to a plurality of sense amps 311. The wordline is accessed by EMATCH line (instruction fetch) or Refill (write) or Test mode (it can be read or write). The column decoder 310 is selected by decoding the address bits. The column decoder 310 is a 4:1 multiplexer, i.e., four pairs of bit lines are muxed to become one pair of data line's which is the input of the sense amp 311. Note, only one column decoder 310 and sense amp 311 is shown for reasons of clarity. Wordline driver 301 is also coupled to write control 302 and read control 312. Write control 302 operates to write information to arrays 309 and 305, while read control 312 has circuitry operable for reading information from arrays 309 and 305. Further discussion of blocks 301–307 is not provided, since such information is not essential to an understanding of the present invention.

Figure 5:
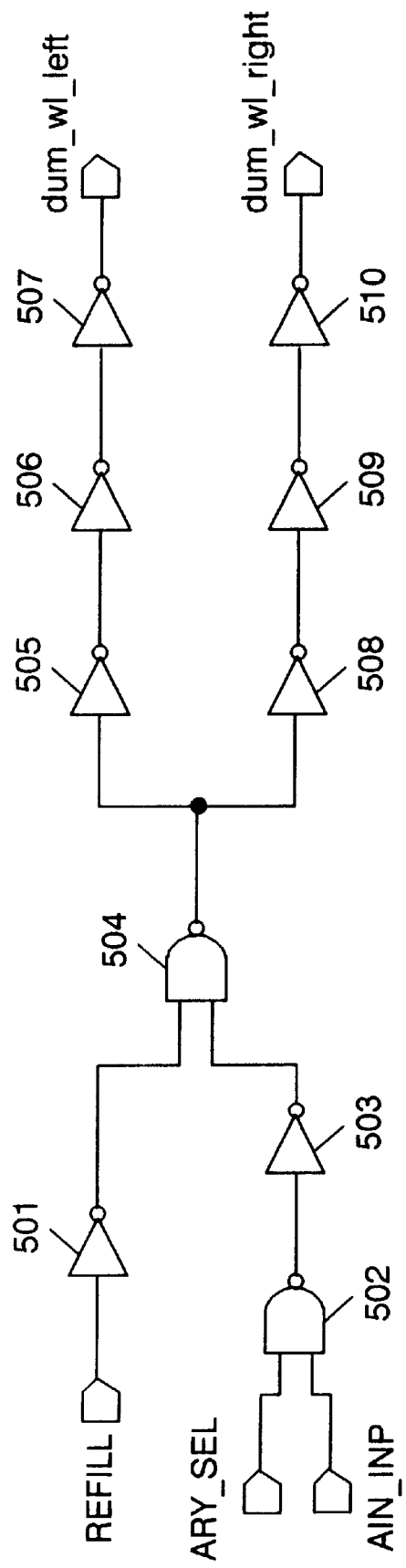
FIG. 5 illustrates logic circuitry for producing dummy word line signals.
Figure 6:
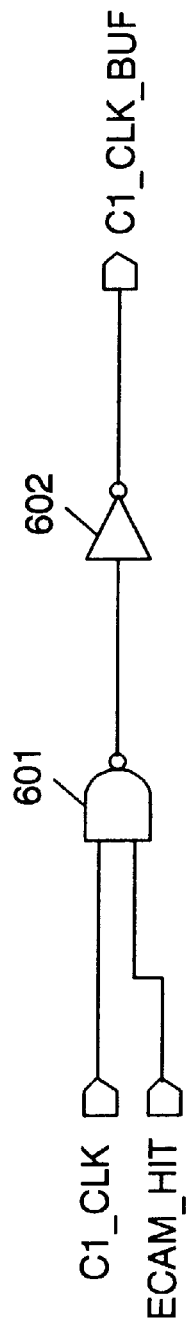
FIG. 6 illustrates logic circuitry for producing a C1$_{13}$CLK_BUF signal to be received by NAND gate 320 illustrated in FIG. 3

Several signals are provided to and emanate from read control circuitry 312. FIGS. 4–6 further illustrate some of this circuitry.

The remaining discussion concerns the present invention, which provides for a means to activate sense amp 311 in a reliable and cost effective manner. Activation of sense amp 311 is performed by activating the signal SE_ENB.

Figure 4B:
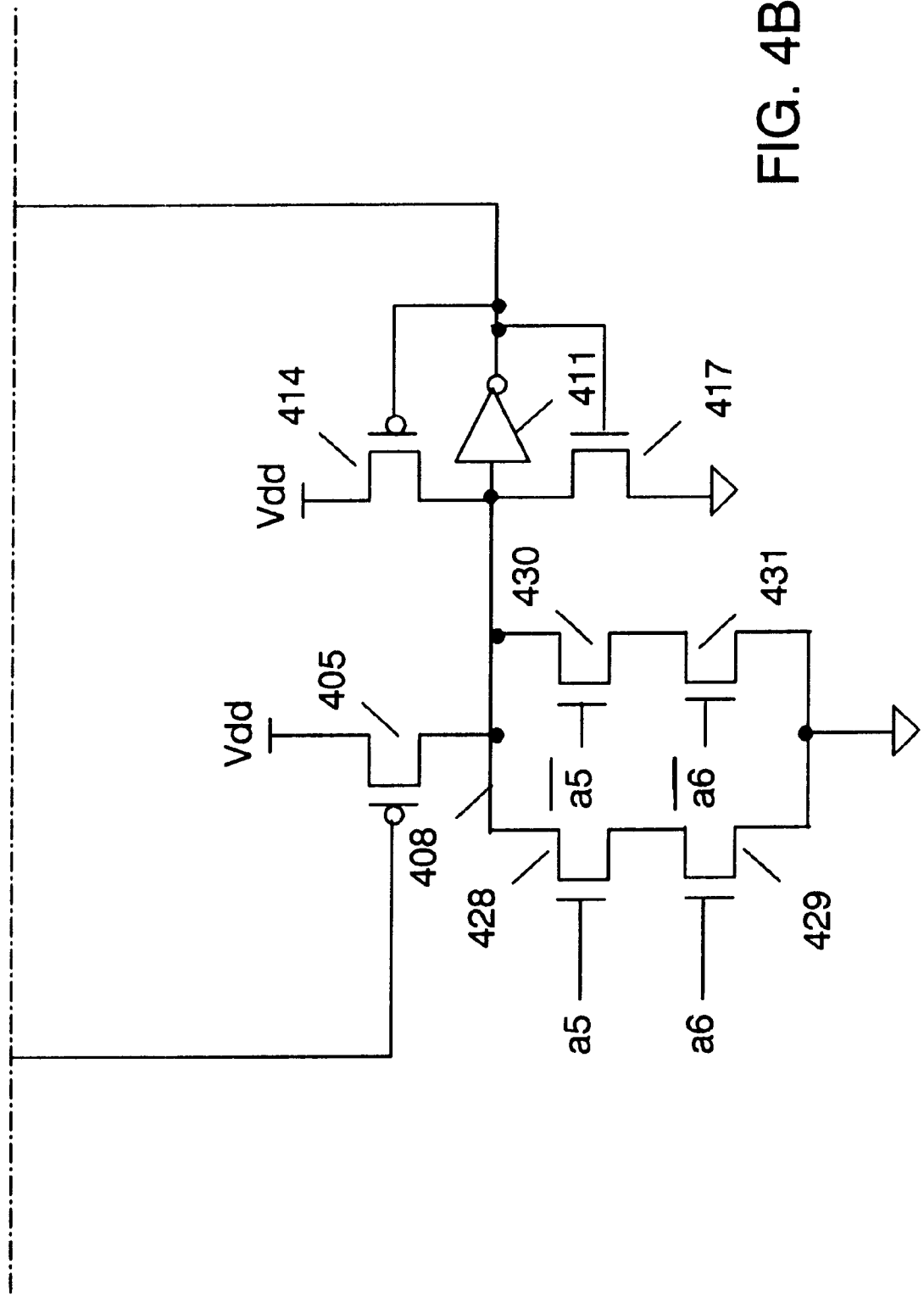

Referring next to FIGS. 4, 4A, 4B and 7, at the beginning of the clock cycle, signal C2_EARLY_CLK toggles from a low to a high state, C1_CLK stays high and C2_CLK stays low. (Three clock signals are employed: C1_CLK and C2_CLK, which are complements of each other and C2_EARLY_CLK which is 500 picoseconds earlier than C2_CLK.) This causes a high signal to be received at both inputs of NAND gate 402 (FIG. 4A). The result is that NAND gate 402 generates a reset (low) signal, which is received by PFETs P-channel field effect transistors) 403–405 to precharge nodes 406–408 high and this forces AIN_INP to toggle low. Now the circuit illustrated in FIG. 4 is in the precharge mode. After 500 picoseconds, C2_CLK will go high and C1_CLK will go low. This action forces the output of NAND gate 402 to go high and puts the circuit of FIG. 4 in the evaluation mode. Now the input of the circuit will wait for the address bits to arrive. The last address bit will trigger this circuit. Please note that devices 412–417 act as keeper devices to maintain a specified output from inverters 409–411.

In the evaluation mode, either the true or complement of addresses a0–a6 (the complements are indicated by a bar over the address designation) will pulse high, when received from processor 201. Addresses a0–a6 are received by NFETs (N-channel field effect transistors) 418–420, 424–425, and 428–429, while the complements of these addresses are received by NFETs 421–423, 426–427, and 430–431. This will result in the pulling of nodes 406–408 to ground, which consequently results in NAND gate 432 producing a low signal, which results in a high signal for signal AIN_INP from the output of inverter 433. If the array is not accessed, then the address bits will stay low and hence this will force signal AIN_INP to be low. As a result, signal AIN_INP is only activated when address signals are received from processor 201 by the array.

Referring next to FIG. 5, there is illustrated further circuitry located within read control 312. The inputs are REFILL, ARY_SEL and the AIN_INP signal generated in FIG. 4. If the signal REFILL is high, then the cache is in the write mode, and hence the sense amp 311 will be off. If the cache is in read mode, REFILL will go low and now it depends upon ARY_SEL and AIN_INP. Signal ARY_SEL is a signal that is activated when the particular sub-array 204–207 is to be accessed for the read request.

If signals AIN_INP and ARY_SEL are high and REFILL is low, then this will result in signals DUM_WL_LEFT and DUM_WL_RIGHT to be forced high through inverters 501, 503, and 505–510 and NAND gates 502 and 504. These signals are also shown in FIG. 3. If any one of signals ARY_SEL or AIN_INP is low, then these DUM_WL signals will be forced low.

Referring next to FIG. 6, there is shown further circuitry within read control 312. In the second half of the cycle, C1_CLK will go high and C2_CLK will go low. Signal C1_CLK and signal ECAM_HIT are ANDed together by the circuitry comprising NAND gate 601 and inverter 602. If all the effective addresses match with the content of ECAM 308, then the ECAM_HIT signal will be high, otherwise this signal will be pulled low, which means that there is an ECAM 308 miss. ECAM_HIT may be produced in a well-known manner by comparing all of the contents of ECAM 308 with the received address from processor 201. The ECAM_HIT signal will wait for signal C1_CLK to go high for evaluation. If there is a hit in the cache sub-array, then signal C1_CLK_BUF will go high.

Returning to FIG. 3, it should be noted that the DUM_WL signals drive the same number of memory cells as a regular wordline. If the C1_CLK_BUF signal is high along with the DUM_WL_LEFT signal, then the combination of NAND gate 320 and inverter 321 will activate the sense enable signal SE_ENB to activate sense amp 311.

As a result of the foregoing, the sense enable signal SE_ENB is only activated if there is a hit within the sub-array 204–207. Otherwise, sense amp 311 is not activated, thus saving power consumption.

If the ECAM_HIT signal is not used to generate SE_ENB, then DL and DLB, which are the inputs of the sense amp 311, are sitting at a VDD level in the MISS case. When the sense amp enable signal goes high, the output of the sense amp will go to an undetermined state because there is no differential voltage on the input of the sense amp. After some delay, the sense amp will resolve itself by going to some known state. During the undetermined state, the sense amp will burn a lot of power (there will be a DC path from VDD to ground). Since there may be 332 sense amps in the cache, there will be a lot of power transferred to ground. The ground level will rise and will effect the functionality of the other circuits in the cache. The present invention relieves the foregoing problem by preventing this problem in the cache by deactivating the sense amp when there is a miss in the cache.

For a regular cycle, the read cycle begins as soon as the wordline is forced high, the valid data is not driven out from the sense amp until the second half (C1_CLK goes high) of the cycle.

The time between the turning on of the wordline to the turning on of the sense amp will increase independent of process variation.

The present invention reduces the sensitivity of the short channel effect in the sense amp. If the process speeds up due to short channel effects, and a cycle time stays the same, more signal margin will be available at the input of the sense amp.

The dummy wordline has the same equal loading as a regular wordline. Both of them will track each other. This will insure that the sense amp will never be on before the wordline driver.

If all the address bits are not arriving at the same time, then the last address bit will trigger the circuit illustrated in FIG. 1. This guarantees that the sense amp will be on after the wordline.

Although the present invention and its advantages have been described in detail, it should be understood that various changes, substitutions and alterations can be made herein without departing from the spirit and scope of the invention as defined by the appended claims.

What is claimed is:

1. A cache memory device comprising:

a memory array, an effective content address memory (ECAM);

a column decoder for accessing the memory array;

a sense amplifier coupled to the column decoder;

first logic circuitry for asserting an output signal when all address bits of a read request have been received during an evaluation phase of the cache memory device;

circuitry for comparing an address of the read request with entries in the ECAM, wherein a hit results when the address of the read request matches an entry in the ECAM, wherein the hit results in a an ECAM hit signal;

second logic circuitry for producing a dummy word line signal in response to the output signal;

third logic circuitry for asserting a sense enable signal in response to the ECAM hit signal and the dummy word line signal; and circuitry for enabling the sense amplifier in response to receipt of the sense enable signal.

2. The cache memory device as recited in claim 1, wherein the third logic circuitry further comprises:

a first NAND gate receiving a clock signal and the ECAM hit signal;

a first inverter connected to an output of the first NAND gate;

a second NAND gate receiving an output of the first inverter and the dummy word line signal; and a second inverter connected between the second NAND gate and the sense amplifier.

3. The cache memory device as recited in claim 2, wherein the second logic circuitry further comprises:

a third NAND gate receiving the output signal and an array select signal asserted when the cache memory is accessed by the read request;

a third inverter receiving an output of the third NAND gate;

a fourth inverter receiving a refill signal negated in response to the read request; and a fourth NAND gate receiving outputs of the third and fourth invertors, wherein the fourth NAND gate outputs the dummy word line signal.

4. A data processing system comprising:

a processor;

a non-volatile storage device;

an input device;

an output device;

a memory;

a bus system for coupling the processor to the non-volatile storage device, the input device, the output device, and the memory; and a cache memory device coupled to the processor, the cache memory device further comprising:

a memory array;

an effective content address memory (ECAM);

a column decoder for accessing the memory array;

a sense amplifier coupled to the column decoder;

first logic circuitry for asserting an output signal when all address bits of a read request have been received during an evaluation phase of the cache memory device;

circuitry for comparing an address of the read request with entries in the ECAM, wherein a hit results when the address of the read request matches an entry in the ECAM, wherein the hit results in a an ECAM hit signal;

second logic circuitry for producing a dummy word line signal in response to the output signal;

third logic circuitry for asserting a sense enable signal in response to the ECAM hit signal and the dummy word line signal; and circuitry for enabling the sense amplifier in response to receipt of the sense enable signal.

5. The data processing system as recited in claim 4, wherein the third logic circuitry further comprises:

a first NAND gate receiving a clock signal and the ECAM hit signal;

a first inverter connected to an output of the first NAND gate;

a second NAND gate receiving an output of the first inverter and the dummy word line signal; and a second inverter connected between the second NAND gate and the sense amplifier.

6. The data processing system as recited in claim 5, wherein the second logic circuitry further comprises:

a third NAND gate receiving the output signal and an array select signal asserted when the cache memory is accessed by the read request;

a third inverter receiving an output of the third NAND gate;

a fourth inverter receiving a refill signal negated in response to the read request; and a fourth NAND gate receiving outputs of the third and fourth invertors, wherein the fourth NAND gate outputs the dummy word line signal.

* * * * *